US009354513B2

(12) United States Patent
Flaum

(10) Patent No.: US 9,354,513 B2
(45) Date of Patent: *May 31, 2016

(54) PHOTOPOLYMER STAMP MANUFACTURING PROCESS AND PREPARATION SYSTEM AND PHOTOPOLYMER STAMP DIES

(71) Applicant: PSA Essentials LLC, Bluffton, SC (US)

(72) Inventor: Richard V. Flaum, Hilton Head Island, SC (US)

(73) Assignee: PSA ESSENTIALS LLC, Bluffton, SC (US)

( * ) Notice: Subject to any disclaimer, the term of this patent is extended or adjusted under 35 U.S.C. 154(b) by 127 days.

This patent is subject to a terminal disclaimer.

(21) Appl. No.: 13/646,171

(22) Filed: Oct. 5, 2012

(65) Prior Publication Data

US 2013/0025479 A1    Jan. 31, 2013

Related U.S. Application Data

(62) Division of application No. 12/417,313, filed on Apr. 2, 2009, now Pat. No. 8,333,148.

(60) Provisional application No. 61/118,308, filed on Nov. 26, 2008, provisional application No. 61/140,189, filed on Dec. 23, 2008.

(51) Int. Cl.
*B41K 1/04* (2006.01)
*G03F 7/00* (2006.01)
*G03F 7/20* (2006.01)

(52) U.S. Cl.
CPC ............... *G03F 7/0015* (2013.01); *B41K 1/04* (2013.01); *G03F 7/2032* (2013.01); *Y10T 428/24479* (2015.01)

(58) Field of Classification Search
USPC .......................................................... 101/28
See application file for complete search history.

(56) References Cited

U.S. PATENT DOCUMENTS

| 2,964,401 | A | 12/1960 | Plambeck, Jr. |
| 2,993,789 | A | 7/1961 | Crawford |
| 3,877,939 | A | 4/1975 | Okai |
| 3,981,583 | A | 9/1976 | Tsuchida et al. |
| 4,064,802 | A | 12/1977 | Funahashi |
| 4,087,182 | A | 5/1978 | Aiba et al. |
| 4,157,261 | A | 6/1979 | Takeda |
| 4,266,007 | A | 5/1981 | Hughes et al. |

(Continued)

FOREIGN PATENT DOCUMENTS

| JP | 10-157264 | 6/1998 |
| WO | WO 98/53371 | 11/1998 |

*Primary Examiner* — Joshua D Zimmerman
(74) *Attorney, Agent, or Firm* — Nixon & Vanderhye P.C.

(57) ABSTRACT

A photopolymer plate manufacturing process utilizes a modified substrate and mask to generate pre-cut and interchangeable single and multi-part stamp dies. Using a modified substrate and mask, a conventional photopolymer plate can be manufactured with a plurality of independent pattern or stamp areas that are readily removable and replaceable on the substrate and do not require cutting. The resulting material is also securable to a plastic stamp or the like without an adhesive, thereby facilitating a stamp with exchangeable patterns. Additionally, with a further modified mask, the stamp dies can be manufactured in two or more separable pieces, which can then be selectively interchanged among multiple stamp dies. An alignment tool facilitates installation of the stamp dies on the stamp mechanism.

3 Claims, 9 Drawing Sheets

(56) References Cited

U.S. PATENT DOCUMENTS

| | | |
|---|---|---|
| 4,286,043 A | 8/1981 | Taylor, Jr. |
| 4,332,873 A | 6/1982 | Hughes et al. |
| 4,432,281 A | 2/1984 | Wall et al. |
| 4,444,607 A | 4/1984 | Lash et al. |
| 4,576,898 A | 3/1986 | Hoffman et al. |
| 4,600,667 A | 7/1986 | Uchida |
| 4,647,524 A | 3/1987 | Sullivan |
| 4,668,607 A | 5/1987 | Wojcik |
| 4,720,448 A | 1/1988 | Mousseau |
| 4,732,829 A | 3/1988 | Sullivan |
| 4,764,449 A | 8/1988 | VanIseghem |
| 4,897,327 A | 1/1990 | Dubin et al. |
| 4,966,827 A | 10/1990 | Sullivan |
| 5,035,981 A | 7/1991 | Kurtz et al. |
| 5,182,056 A | 1/1993 | Spence et al. |
| 5,252,428 A | 10/1993 | Kawamoto et al. |
| 5,266,426 A | 11/1993 | Tsuchiya et al. |
| 5,370,968 A | 12/1994 | Goss et al. |
| 5,372,669 A | 12/1994 | Freedman |
| 5,407,764 A | 4/1995 | Cheema et al. |
| 5,750,315 A | 5/1998 | Rach |
| 5,776,661 A | 7/1998 | Casaletto et al. |
| 5,972,566 A | 10/1999 | Venkataraman |
| 6,095,046 A | 8/2000 | Lookholder et al. |
| 6,422,140 B1 | 7/2002 | Lookholder et al. |
| 6,708,614 B2 | 3/2004 | Lookholder et al. |
| 6,820,550 B2 | 11/2004 | Lookholder et al. |
| 8,333,148 B2 * | 12/2012 | Flaum ............................ 101/379 |
| 2006/0000376 A1 | 1/2006 | Faber |

* cited by examiner

PHOTOPOLYMER STAMP MANUFACTURING PROCESS AND PREPARATION SYSTEM AND PHOTOPOLYMER STAMP DIES

CROSS-REFERENCES TO RELATED APPLICATIONS

This application is a divisional of U.S. patent application Ser. No. 12/417,313, filed Apr. 2, 2009, pending, which claims the benefit of U.S. Provisional Patent Application Ser. No. 61/118,308, filed Nov. 26, 2008, and U.S. Provisional Patent Application Ser. No. 61/140,189, filed Dec. 23, 2008, the entire content of each of which is herein incorporated by reference.

STATEMENT REGARDING FEDERALLY SPONSORED RESEARCH OR DEVELOPMENT (Not Applicable)

BACKGROUND OF THE INVENTION

The invention relates to a photopolymer plate manufacturing process and, more particularly, to such a process utilizing a modified substrate and mask to generate pre-cut and interchangeable single and multi-part stamp dies. Additionally, the invention relates to a photopolymer plate/stamp application or installation device and process for aligning and installing pre-cut and interchangeable stamp dies on a platen of a stamp mechanism.

A photopolymer cures or becomes solid when exposed to light typically in the ultraviolet (UV) spectrum. In a conventional process, with reference to FIG. 1, using a machine that generates UV light for this purpose, a negative 2 is placed on an illuminating surface of the machine A clear cover film 3 similar to plastic wrap or the like is placed over the negative and serves to protect the negative from the photopolymer material. Damming tape 4 is secured around the perimeter of the negative 2. The damming tape 4 has a preset thickness and thus defines a cavity or container for the photopolymer material on the illuminating surface.

The photopolymer material is placed or poured onto the illuminating surface and spread across the cover film 3 over the negative 2. The damming tape 4 provides a barrier for the photopolymer material. Subsequently, a treated substrate is positioned over the polymer material on the illuminating surface. The treatment on the prior art substrate causes the substrate to bind to the photopolymer plate after the illumination process.

The machine is closed over the substrate, and the material is illuminated from both sides. The photopolymer material that is exposed to the UV illumination through the negative cures or hardens while the unexposed material remains in a liquid form.

After a washing process to remove the unexposed material, a photopolymer plate or sheet results including cured (raised) portions corresponding to the negative patterns connected together on the substrate. Each of the patterns can then be separately cut and separated from the photopolymer plate as a single die and applied to an ink stamp (such as a known self-inking stamp as described in U.S. Pat. No. 4,432,281).

A problem arises in the prior art method in that the procedure for separating the raised patterns from the photopolymer plate is difficult and time-consuming due to the thickness of the resulting plate and the hardness of the material. Attempts have been made to derive devices for separating multiple patterns from the photopolymer sheet at one time, but such devices have resulted in only marginal improvement.

Another problem arises in that the resulting photopolymer plate does not lend itself to enable the patterns to be readily interchanged on a single stamp mechanism. That is, the application of the pattern and substrate requires an adhesive or the like to secure the stamp die to the stamp mechanism. As a consequence, it is also considerably difficult and time-consuming to remove a pattern and replace it with another. Still further, yet another manufacturing step is required in order to display or store a plurality of patterns on a single page (e.g., for scrapbooking or other arts and crafts).

BRIEF SUMMARY OF THE INVENTION

The described embodiments endeavor to overcome the drawbacks noted above with regard to the conventional system. The photopolymer stamp manufacturing process utilizes a stamp preparation system that blocks UV light from curing the photopolymer material between the patterned areas of the negative. Additionally, the material of the substrate is selected such that the substrate does not permanently attach to the stamp dies As a consequence, a plurality of stamp dies are independently removable from the substrate without requiring cutting or the like. Each of the stamp dies is removable from and re-attachable to the substrate without an adhesive. As a consequence, a plurality of interchangeable stamp dies can be stored and displayed on a single sheet.

In an alternative embodiment, the materials for manufacturing the stamp dies are configured such that the resulting stamp dies include at least a first image portion and a second image portion that are detachably connected to each other. In a preferred arrangement, the first and second image portions are connected as a result of the manufacturing process by easily detachable spokes or the like. As a consequence, the first and second image portions of multiple stamp dies are readily interchangeable. That is, the second image portion from one stamp die can be combined with the first image portion of another stamp die to create a customized stamp at the user's preference.

The material of the stamp dies also enables the stamp dies to be attached to the platen of an ink stamp without an adhesive. An alignment tool enables users to exchange stamp dies on the ink stamp. As a consequence, users need only purchase a single ink stamp mechanism and can selectively change the stamp die at any time.

With the stamp dies including separable first and second image portions, the alignment tool can also accommodate exchanging only the first image portion or only the second image portion with another. In a preferred embodiment, the stamp dies also include an alignment notch to facilitate installation and alignment of a first image portion and a second image portion.

BRIEF DESCRIPTION OF THE DRAWINGS

These and other aspects and advantages of the described embodiments will be described with reference to the accompanying drawings, in which.

DETAILED DESCRIPTION OF THE INVENTION

Figure 1:
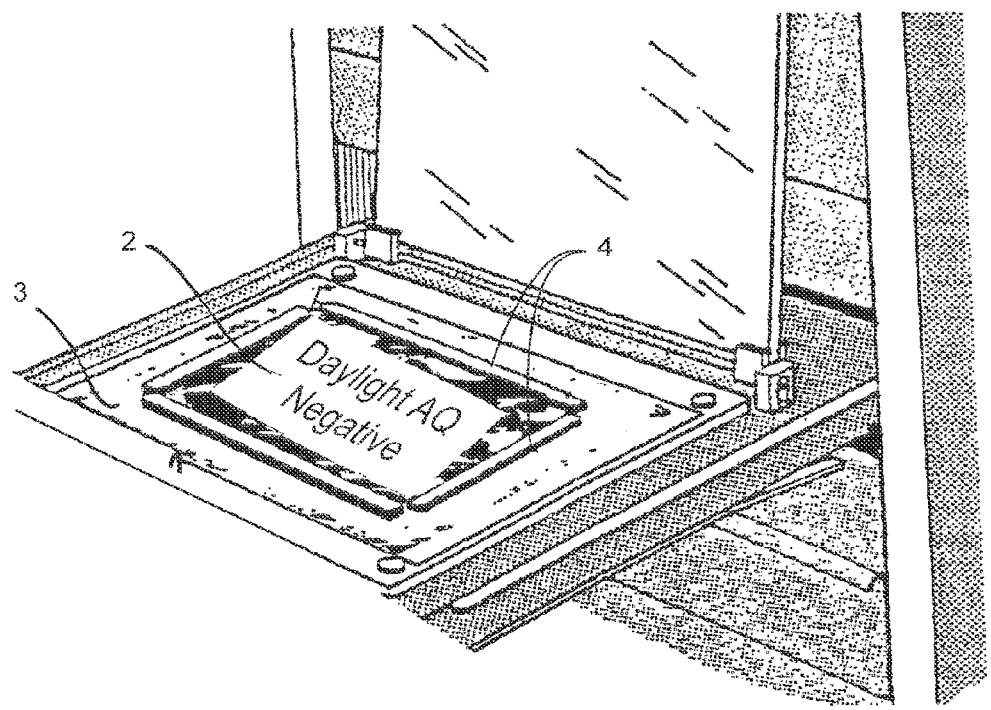
FIG. 1 illustrates a UV light source with materials for manufacturing a stamp die.
Figure 2:
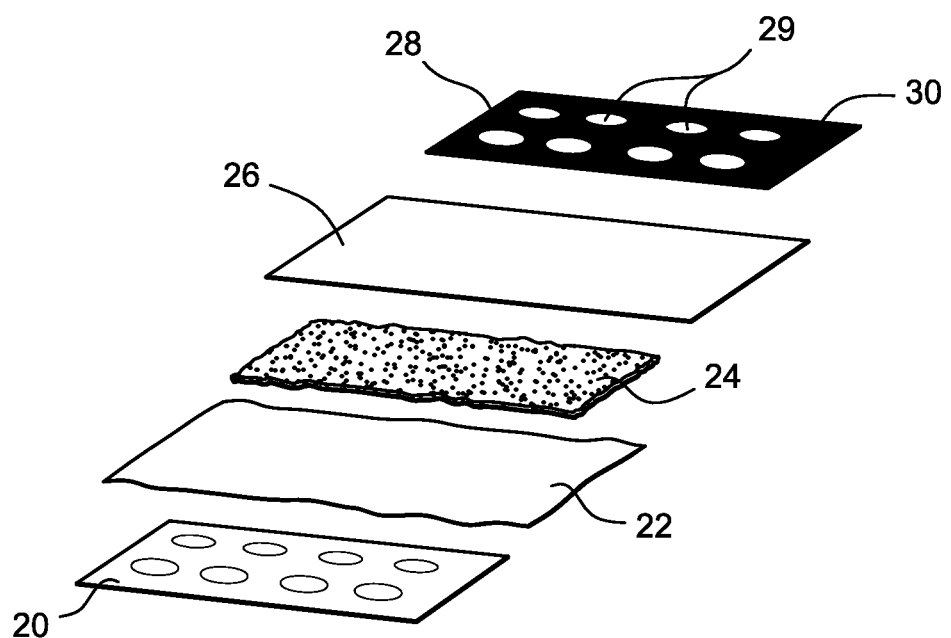
FIG. 2 is an exploded view of the layers in the photopolymer stamp preparation system used for manufacturing the stamp die sheets.
Figure 4A:
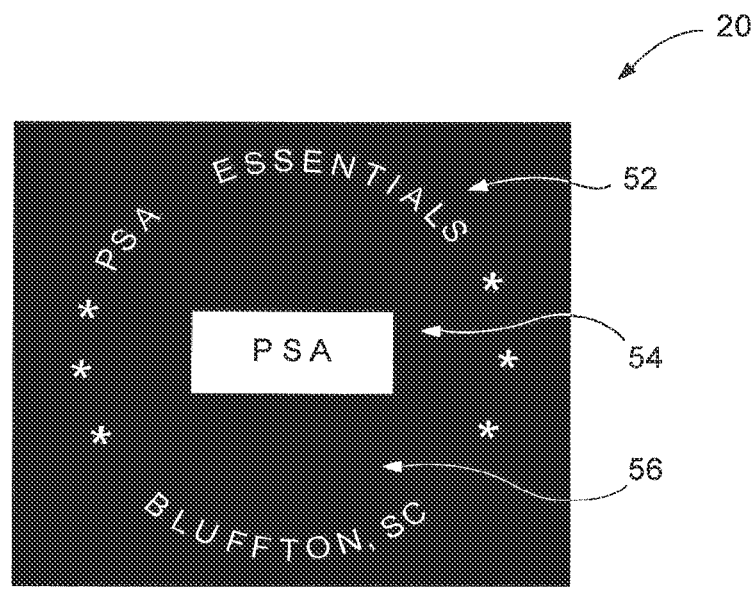
FIG. 4A is a close-up view of one element of a negative for manufacturing the stamp dies.

In general, the process is similar to the prior art process described above up to the application of the photopolymer material to the illuminating surface. FIG. 2 shows the negative 20 that is placed on the illuminating surface. FIG. 4A is a close-up view of an exemplary single image on the negative 20. The cover film 22 is secured over the negative 20, and the photopolymer material 24 is spread on the cover film 22. Like the prior art process, a clear backing or substrate 26 is placed over the polymer material 24 prior to exposure. In contrast with the prior art substrate, however, the substrate 26 of the invention is not treated, so the polymer does not permanently bond to the substrate. The substrate 26 is preferably formed of a clear acetate material or is a clear polystyrene sheet, although other material sheets may be suitable.

A preferred embodiment of the invention additionally includes a mask layer 28 that is aligned with the negative 20 on top of the substrate 26 prior to exposure. The mask layer 28 may be provided with alignment features (not shown) such as small holes or the like to facilitate alignment with the negative 20.

With the materials in place on the illuminating surface, the machine top (not shown) is closed, and the photopolymer material is exposed to UV illumination. In the prior art process, with the modified substrate and without the mask layer 28, although UV illumination passing through the negative effects the patterned curing of the photopolymer material on a bottom side, the UV illumination from the top surface passes through the substrate to cure the entire top surface of the photopolymer material. In this manner, the prior art photopolymer plate resulting from the process is a one-piece continuous sheet that is flat on one side and includes raised areas corresponding to the patterns defined by the negative on an opposite side. As noted above, the one-piece continuous sheet must then be cut to separate the individual raised patterns or stamp dies for use. In contrast with this prior art photopolymer plate, the present embodiment utilizes the modified substrate 26 and mask 28. As shown in FIG. 2, in a preferred arrangement, the pattern areas on the negative 20 have a circular perimeter so that the resulting stamp dies are generally formed as circular discs. The mask 28 is provided with corresponding transparent circular portions 29 and opaque portions 30 surrounding the transparent circular portions 29. In this manner, illumination from the machine top is blocked by the mask 28 through the substrate 26 except for the patterned areas on the negative 20. The areas between and around the patterns thus remain in liquid form and can be washed away with the conventional washing process.

When the washing process is complete, what remains are the substrate and a plurality of separate and independent stamp dies (disks with the exemplary FIG. 2 materials). Since the mask 28 blocks the UV light on the top side of the photopolymer material 24, the space between the patterns is not cured and thus remains in liquid form to be washed away in the washing process. The resulting patterns do not require cutting and can be readily independently removed from the substrate for installation into a self-inking stamp or the like.

An important component of the process is the use of the modified substrate 26 that does not permanently adhere to the cured pattern areas. Rather, the independent patterned areas are readily removable from the substrate. Moreover, it has been discovered that the inherent tackiness of the cured photopolymer material is not only removable from and replaceable on the substrate, but is readily attachable to the plastic stamp platen or the like of the stamp mechanism without an adhesive or other securing material. That is, using a proprietary aligning/installing mechanism (described below), an individual pattern can be removed from the substrate and installed in the stamp mechanism then subsequently removed from the stamp and replaced on the substrate. Multiple stamps on the substrate thus can be readily stored or displayed on a single sheet and can be easily interchanged on a single stamping apparatus. Additionally, the multiple stamp dies on the substrate can be removed from and re-attached to the substrate without an adhesive.

In another preferred embodiment, the materials for stamp preparation are modified to create a stamp die including separable first and second image portions so that the image portions of various stamp dies can be interchanged among one another. FIG. 4A shows a single section from the negative 20 with an exemplary image or patterned area thereon. On a full-size negative 20, the negative 20 would include a plurality of patterned areas on a single sheet. In a preferred configuration, on an 8½"×11" size sheet, twenty-four patterned areas may be provided for preparation of twenty-four separate stamp dies. Of course, the number of patterned areas, and thus the number of stamp dies, produceable on a single sheet, is relative to the size and shape of the patterned areas, the size of the machine, etc. For example, it is possible to produce a sheet of the second image portions only, and in the preferred embodiments, on an 8½"×11" size sheet, up to forty patterned areas may be provided.

With reference to FIG. 4A, the exemplary patterned area includes a first image portion 52 (particularly referencing the words and images in a circular configuration on the patterned image), and a second image portion 54 in the center portion of the patterned area. The opaque space between the first image portion and the second image portion serves as negative space or a negative spacer 56 that blocks the UV illumination from the photopolymer material. Since the area between the image portions 52, 54 is opaque and the UV illumination is blocked, the first and second image portions remain separate.

Figure 3:
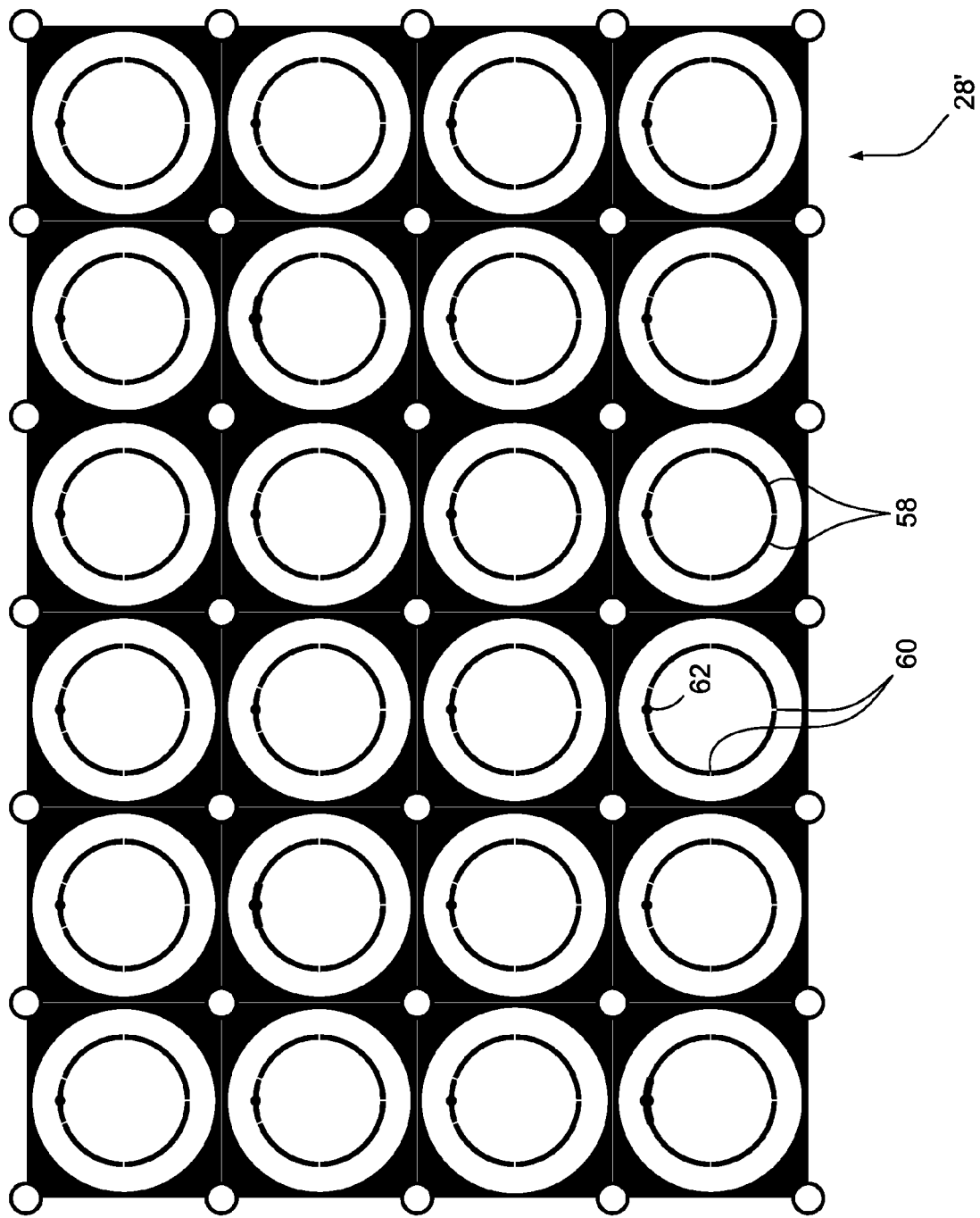
FIG. 3 shows a modified mask for an embodiment with stamp dies including separable image portions.

FIG. 3 shows a modified mask 28' that can be used in place of the mask 28 shown in FIG. 2. Each area of the mask 28' corresponding to the patterned areas on the negative includes mask spacers 58 in alignment with the negative spacers 56 that block the UV illumination from the photopolymer material to separate the first and second image portions 52, 54. The mask 28' additionally includes a plurality of mask spokes 60 that permit passage of the UV illumination to enable curing of spokes that connect the first and second image portions 52, 54. In the preferred embodiment, the negative 20 and the mask 28' are configured such that the first image portion 52 is ring-shaped and the second image portion 54 is disc-shaped and sized to fit within the first image portion 52. With the mask spokes 60 enabling thin spokes to connect the first image portion 52 and the second image portion 54, the first and second image portions 52, 54 are readily separable. The mask may alternatively be configured without the mask spokes 60 such that the first and second image portions 52, 54 are pre-separated.

Figure 4B:
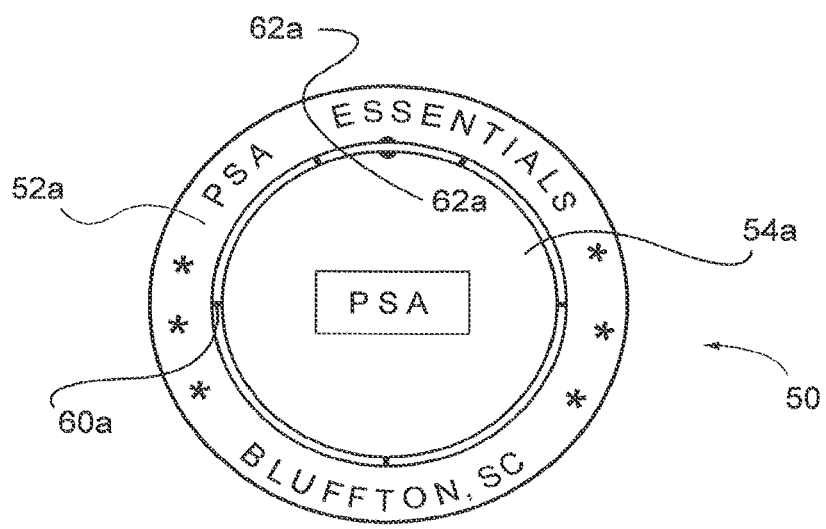
FIG. 4B shows an exemplary stamp die manufactured by the described method.

FIG. 4B shows an exemplary stamp die 50 constructed using the photopolymer stamp preparation system including the modified mask 28'. The stamp die 50 includes a first image portion 52a including a raised surface corresponding to a first partial image of the stamp die, and a second image portion 54a including a raised surface corresponding to a second partial image of the stamp die. By virtue of the structure of the mask 28', the first image portion 52a and the second image portion 54a are detachably connected via spokes 60a. In addition to enabling the first and second image portions to be readily separated, the spokes 60a also serve to facilitate installation of the stamp die prior to the image portions being separated.

As shown in correspondence with the negative (FIG. 4A) and the mask (FIG. 3), the first image portion 52a is preferably ring-shaped, and the second image portion 54a is preferably disc-shaped and sized to fit within the first image portion 52a. With this structure, the second image portion 54a can be easily detached and separated from the first image portion 52a and interchanged with respective first and second image portions of another stamp die. For example, the second image portion 54a shown in FIG. 4B can be replaced during the holiday season with a second image portion 54a including an angel or holiday tree or the like. Each stamp die can thus be customized according to user preference. In this context, the mask 28' may be provided with an alignment notch mask 62 to generate an alignment notch 62a in the stamp die 50 to thereby facilitate alignment of an exchanged second image portion 54a in the first image portion 52a. Of course, other shapes and configurations may be contemplated, and the invention is not necessarily meant to be limited to the exemplary embodiments described and shown.

A device and process for aligning and installing the separable stamp dies to the platen of the stamp mechanism will be described with reference to FIGS. 5-12. With the illustrated aligning/installing mechanism, an individual pattern can be removed from the manufactured substrate and installed in the stamp mechanism, then subsequently the die pattern can be removed from the stamp and replaced on the substrate. Multiple stamps on the substrate can be readily stored or displayed in a single sheet and can be easily interchanged on a single stamping apparatus.

Figure 5:
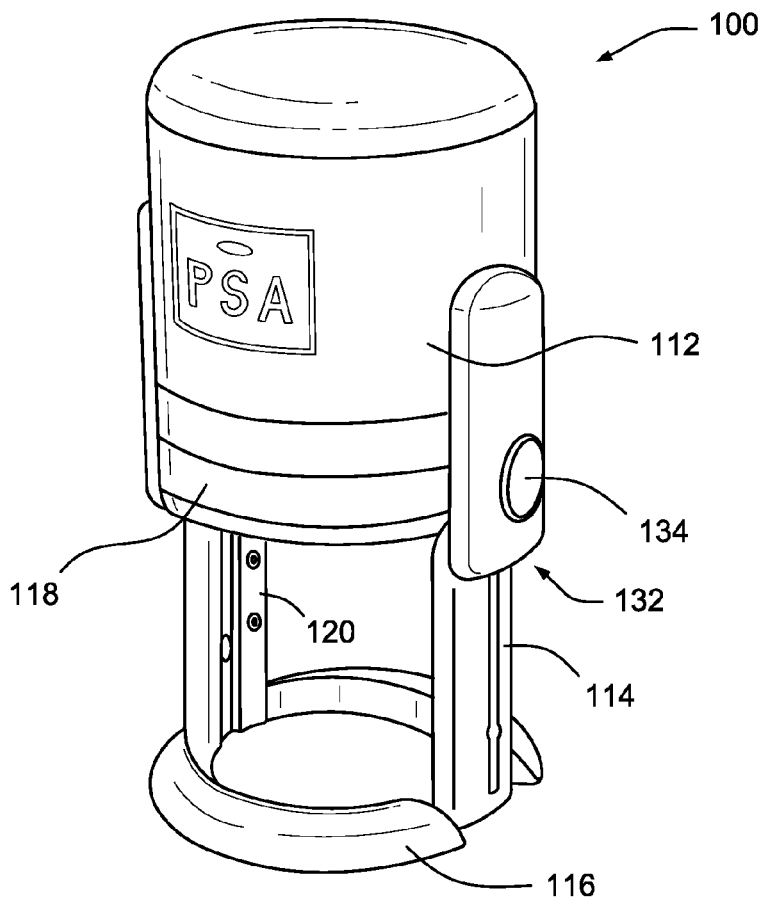
FIG. 5 is a perspective view of an exemplary stamp mechanism.

FIG. 5 is a perspective view of an exemplary stamp mechanism 100 usable with the installation and alignment device/method of the invention. The stamp mechanism includes an actuator housing 112 that is manually displaceable to and from a stamping position along a rail frame including rails 114 and a base support 116. The base support 116 is secured at distal ends of the rails 114. An ink pad 118 is held within the rail frame, and a stamp platen is displaceable between a retracted position in contact with the ink pad 118 and a stamping position in contact with the surface on which the base 116 sets by displacement of the housing 112. A cam mechanism 120 attached to the rails 114 turns the stamp platen so that the inked patterned side of the stamp die affixed to the stamp platen comes in contact with the surface on which the base 116 is set. A spring mechanism within the housing 112 biases the housing 112 toward the position shown in FIG. 5, with the stamp platen and die facing upward and engaged with the ink pad 118. The stamping mechanism shown in FIG. 5 is well known.

As discussed above, the inherent tackiness of the cured photopolymer material is readily attachable to the plastic stamp platen without an adhesive or other securing material. As such, with the stamp die properly aligned, simply pressing the stamp platen on a back side of the stamp die is sufficient to secure the stamp die for use. When it is desired to change the stamp die, the die affixed to the platen can be manually removed, and a replacement die can be quickly and easily secured.

Figure 6:
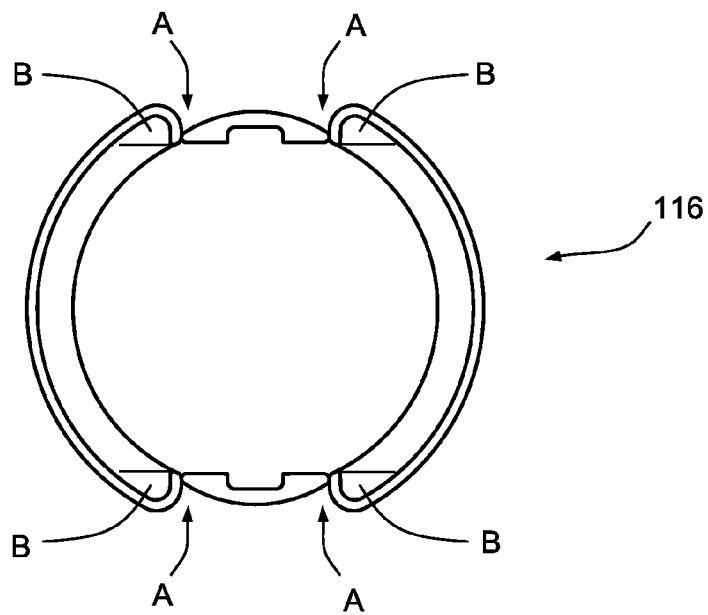
FIG. 6 is an underside view of the support base of the stamp mechanism.
Figure 7:
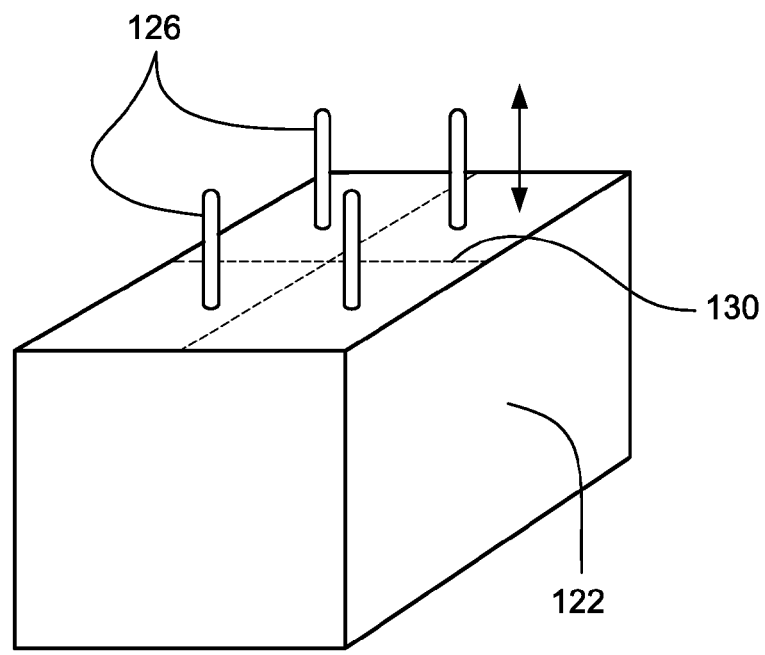
FIGS. 7 and 8 illustrate an exemplary aligning apparatus.
Figure 8:
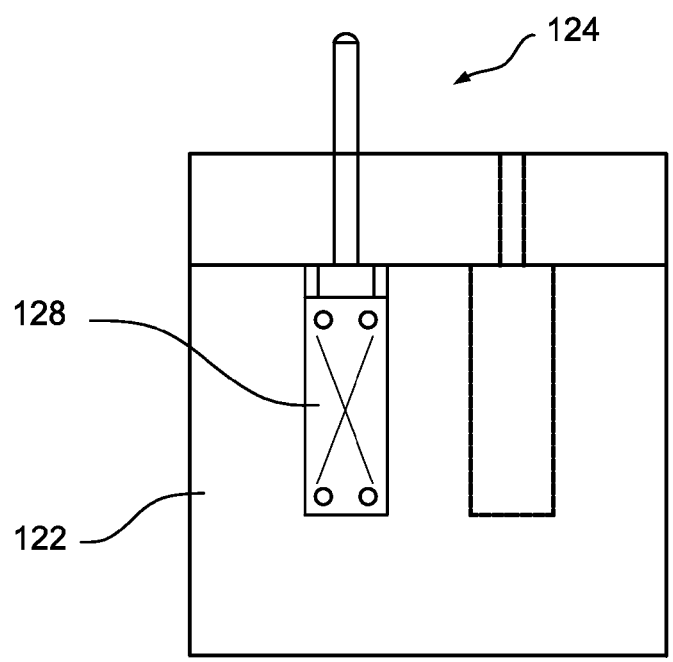

FIG. 6 is an underside view of the support base 116 of the stamp mechanism 100. It is preferable for the alignment mechanism to utilize features of the support base 116 to perform the aligning function. FIGS. 7 and 8 illustrate a first exemplary aligning apparatus of a preferred embodiment. A support block or base 122 houses and supports four independently retractable spring pin mechanisms 124. Each mechanism 124 includes an extendible and retractable pin 126 and a spring support 128 that biases the pins 126 toward an extended position. Each of the pins 126 can be fully retracted into the block 122. An alignment graphic 130 or the like is provided on a top surface of the block 122. With continued reference to FIGS. 6 and 7, the pins 126 are spaced and aligned to fit securely in the shoulders A shown in FIG. 6. The housing 112 of the stamp mechanism (FIG. 5) includes support legs 132 to which the stamp platen is attached. A width of the support legs 132 corresponds to the space between the shoulders A shown in FIG. 6. The support legs 132 thus set on top of the pins 126.

Since the stamp dies are generally translucent, an individual stamp die for installation can be placed on the block 122 using the alignment graphic 130. With the stamp die in position, the stamp mechanism 100 is secured on the block 122 via pins 126 set in the shoulders A. As the housing 112 is pressed down, the support legs 132 push the pins 126 into the block 122 while maintaining alignment by engagement of the pins 126 in the shoulders A. The housing 112 is pressed down until the stamp platen comes in contact with the stamp die, and the stamp die is secured to the stamp platen. In some arrangements, depending on the swinging path of the stamp platen, prior to setting the pins 126 in the shoulders A, it may be necessary or desirable to lock the stamp mechanism 100 in a stamping position using a known locking mechanism of the stamp, which is actuated via lock buttons 134 (FIG. 5).

Figure 9:
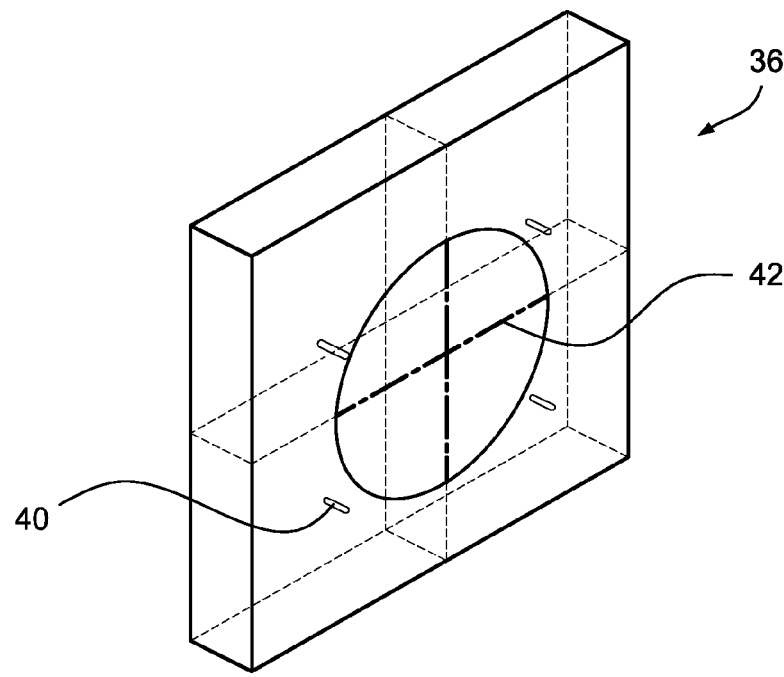
FIGS. 9 and 10 show an alternative alignment mechanism.
Figure 10:
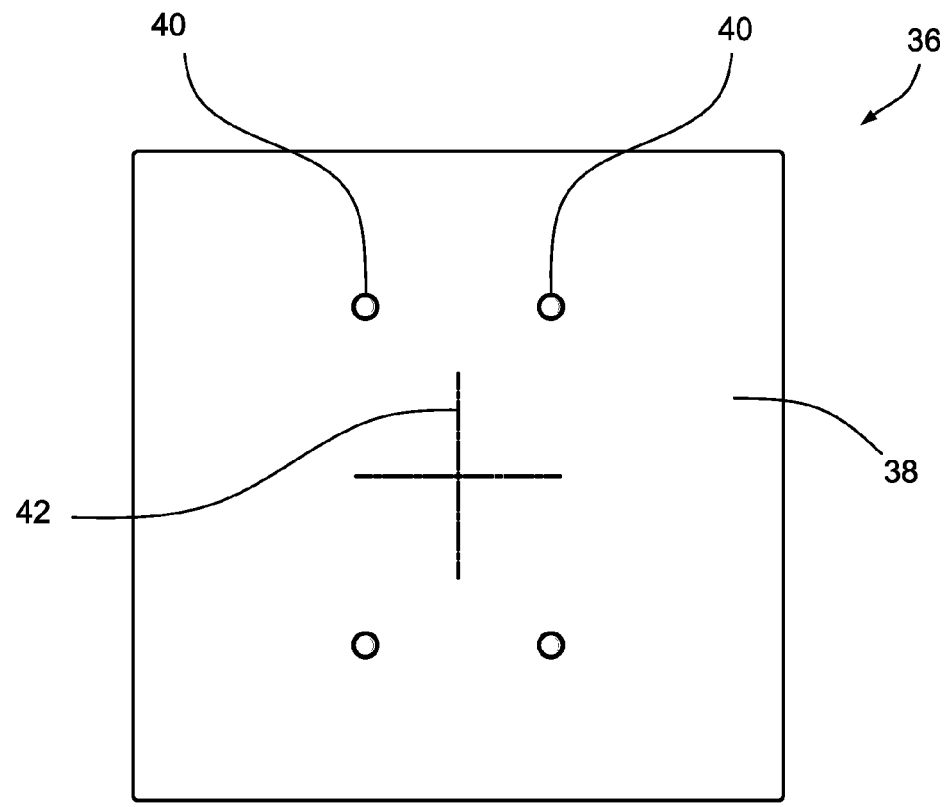

FIGS. 9 and 10 show an alternative alignment mechanism 36. In this embodiment, the alignment mechanism 36 includes a thin plate 38 formed of glass, plastic or the like and four pins 40 secured to the plate 38. The pins 40 can be secured in any suitable manner. An alignment graphic 42 is shown on the plate 38. Referring again to FIG. 6, the support base 116 of the stamp mechanism 100 includes four small generally triangularly-shaped cavities B. The alignment pins 40 are spaced and arranged to fit within the cavities B on the support base 116. With a stamp die aligned using the alignment graphic 42, the base is secured on the pins 40 by engaging the pins 40 in the cavities B, and the stamp die is secured to the stamp platen by pressing down on the housing 112 until the platen engages the stamp die.

Figure 11:
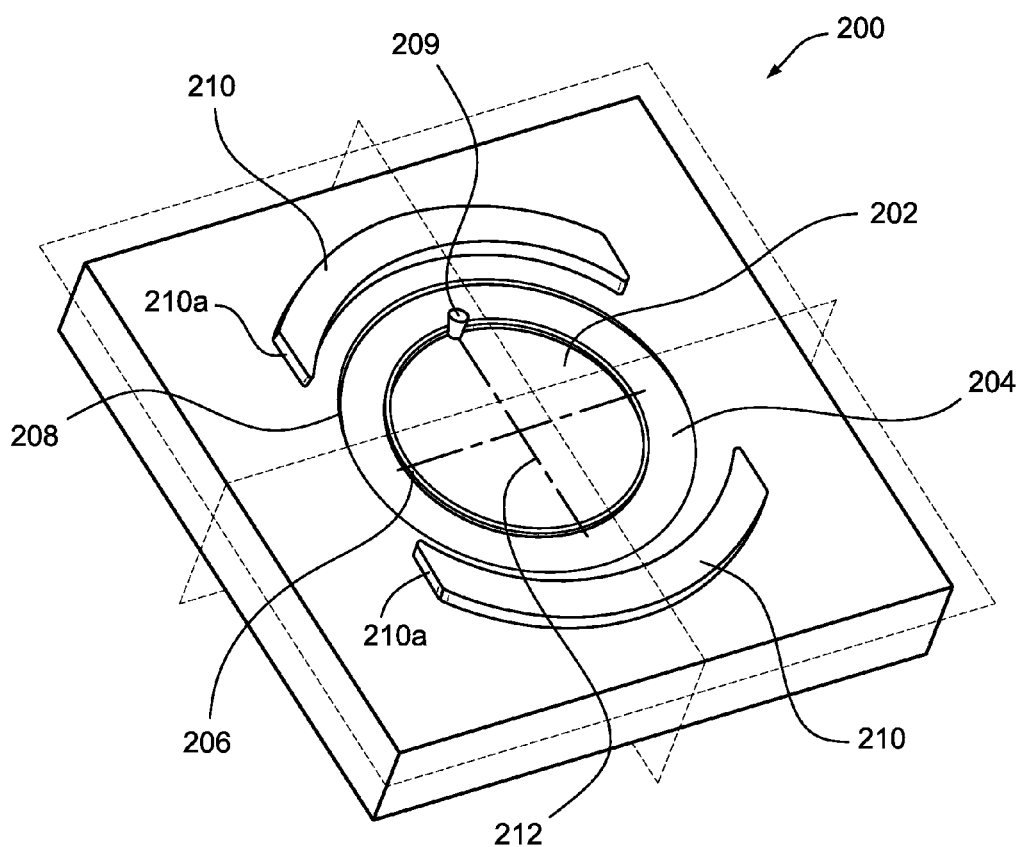
FIGS. 11 and 12 show yet another alternative alignment mechanism.
Figure 12:
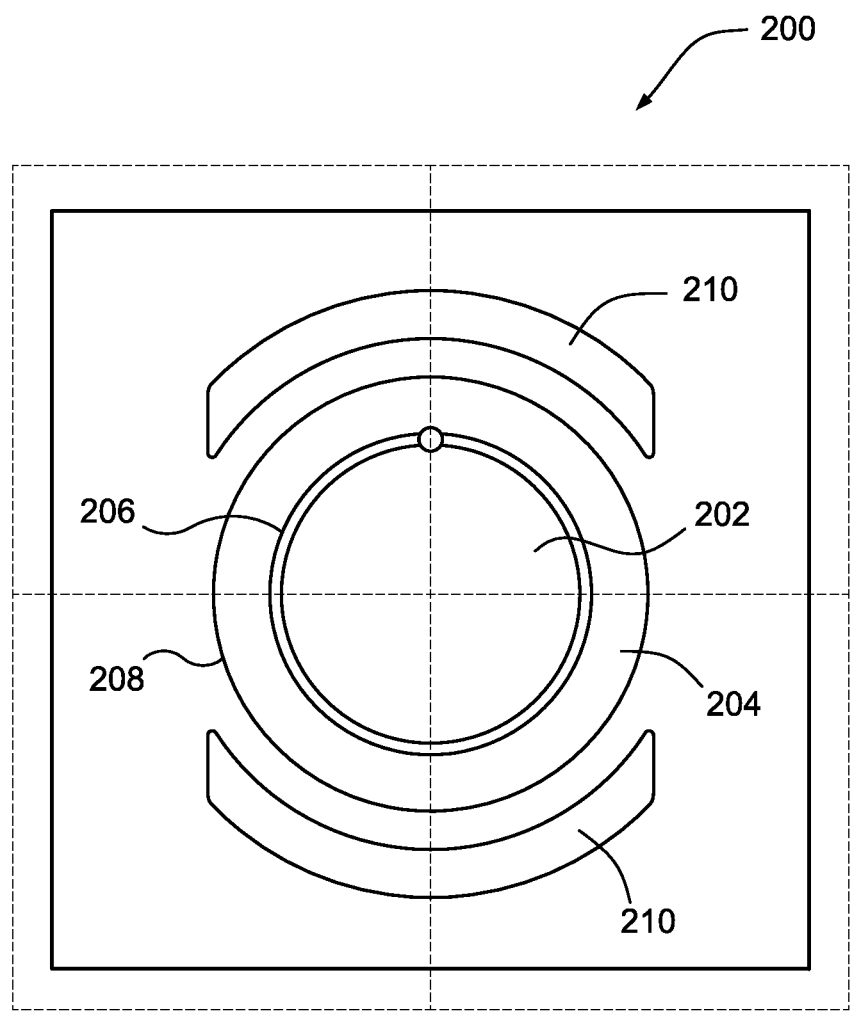

Yet another alternative alignment tool is shown in FIGS. 11 and 12. The alignment tool 200 is particularly suited for aligning and installing the two-piece stamp dies of the embodiment shown in FIG. 4B. Preferably, the alignment tool 200 is formed of a molded one-piece construction of any suitable moldable material. The tool 200 includes a center section 202 and a perimeter section 204 delineated by a raised border 206. An exterior border 208 delimits the perimeter section 204.

The center section 202 is sized generally corresponding to the second image portion 54a of the stamp die 50 (see FIG. 4B). The perimeter section 204 is sized generally corresponding to the first image portion 52a of the stamp die 50. An alignment post 209 is disposed between the center section 202 and the perimeter section 204 and is engageable by the alignment notches 62*a* of the stamp die 50.

The tool 200 also includes shoulders 210 that are spaced apart and sized to receive corresponding portions of the base 116 of the stamp mechanism 100 (see FIGS. 5 and 6). As seen in FIG. 5, the base 116 is generally conically shaped, and the shoulders 210 may be correspondingly tapered so that the base 116 is securable to the tool 200 in a tight tolerance fit. Ends 210A of the shoulders 210 are sized and positioned to fit closely within the cavity wall (of cavity B shown in FIG. 6) in a secure fit.

As discussed previously, the stamp dies 50 are constructed of a material having inherent tackiness such that the stamp dies are attachable to a platen on the ink stamp without an adhesive. As such, in order to install a stamp die on the platen of the stamp mechanism, a desired first image portion 52*a* is set image side down in the perimeter section 204 of the tool 200 with the alignment slot 62*a* engaging the alignment post 209. A desired second image portion 54*a* is positioned image side down in the center section 202 with the alignment notch 62*a* engaged with the alignment post 209. Alignment indicia 212 such as cross-hairs or the like may be provided to facilitate alignment of the first and second image portions.

The support base 116 of a stamp mechanism 100 having an empty platen is secured over the shoulders 210 of the tool 200. By virtue of the shape and size of the shoulders 210, the support base 116 is accurately positioned on the tool 200 within a tight tolerance. The housing 112 of the stamp mechanism 100 is then pressed down until the stamp platen comes in contact with the stamp die, and the stamp die is adhered to the stamp platen.

With the use of a modified substrate and mask, a conventional photopolymer plate can be manufactured with a plurality of independent pattern or stamp areas that are readily removable and replaceable on the substrate and do not require cutting. The resulting material is also securable to a plastic stamp or the like without an adhesive, thereby facilitating a stamp with exchangeable patterns. Additionally, with a further modified mask, the stamp dies can be manufactured in two separable pieces, which can then be selectively interchanged among multiple stamp dies. An alignment tool facilitates installation of the stamp dies on the stamp mechanism.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A plurality of stamp dies manufactured according to a method comprising:
    (a) placing the negative on the bottom illuminating surface of the UV light source, the negative including a plurality of patterned areas respectively corresponding to the stamp dies to be formed;
    (b) placing a photopolymer material over the negative;
    (c) positioning a substrate over the photopolymer material;
    (d) placing a mask over the substrate in alignment with the negative, the mask blocking UV illumination from the top illuminating surface through the substrate except for the patterned areas; and
    (e) illuminating the negative, the photopolymer material, the substrate and the mask with the top illuminating surface and the bottom illuminating surface, resulting in the plurality of stamp dies,
    the method further comprising:
    providing the patterned areas on the negative with a first image portion and a second image portion, the patterned areas having negative spacers that block the UV illumination from the photopolymer material to separate the first and second image portions;
    providing the mask with mask spacers in alignment with the negative spacers that block the UV illumination from the photopolymer material to separate the first and second image portions; and
    providing the mask with mask spokes that permit passage of the UV illumination to connect the first and second image portions.

2. A plurality of stamp dies manufactured using a photopolymer preparation system including a negative and a photopolymer material, the photopolymer preparation system having been exposed to a UV light source, wherein each of the stamp dies comprises a first part and a second part that are independently separable without cutting, the first parts of the plurality of stamp dies being different from one another and being interchangeable with one another, and the second parts of the plurality of stamp dies being different from one another and being interchangeable with one another, wherein the respective first and second parts of the plurality of stamp dies being interchangeable enables the stamp dies to be selectively reconfigured, and wherein each of the stamp dies includes a raised surface corresponding to a patterned area on the negative.

3. A plurality of stamp dies according to claim 2, wherein the first part and the second part of each of the plurality of stamp dies are initially separably connected to each other by a detachable connector.

\* \* \* \* \*